(12) United States Patent
Han et al.

(10) Patent No.: US 10,615,000 B2
(45) Date of Patent: Apr. 7, 2020

(54) ELECTRON BEAM MICROSCOPE

(71) Applicant: Carl Zeiss Microscopy GmbH, Jena (DE)

(72) Inventors: Luyang Han, Heidenheim (DE); Joerg Fober, Heuchlingen (DE); Stefan Meyer, Aalen (DE); Wolfgang Berger, Gerstetten (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 16/364,894

(22) Filed: Mar. 26, 2019

(65) Prior Publication Data

US 2019/0304742 A1 Oct. 3, 2019

(30) Foreign Application Priority Data

Mar. 27, 2018 (DE) .................. 10 2018 204 683

(51) Int. Cl.
*H01J 37/244* (2006.01)
*H01J 37/06* (2006.01)
*H01J 37/26* (2006.01)

(52) U.S. Cl.
CPC .......... *H01J 37/265* (2013.01); *H01J 37/244* (2013.01); *H01J 2237/2441* (2013.01); *H01J 2237/2448* (2013.01); *H01J 2237/2482* (2013.01); *H01J 2237/24475* (2013.01); *H01J 2237/24495* (2013.01)

(58) Field of Classification Search
CPC ............... H01J 37/28; H01J 2237/2817; H01J 2237/2444; H01J 2237/24495; H01J 2237/244; H01J 2237/24475; H01J 2237/2448; H01J 2237/28; H01J 37/222; H01J 37/26; G01N 23/203; G01N 2223/418; G01N 23/2251
USPC .................. 250/310, 307, 397, 396 R, 492.3
See application file for complete search history.

(56) References Cited

U.S. PATENT DOCUMENTS 4,559,450 A * 12/1985 Robinson ............. G01N 23/203
250/310
4,600,839 A 7/1986 Ichihashi et al.
(Continued)

OTHER PUBLICATIONS

P. Lechner et al., "Silicon drift detectors for high resolution, high count rate x-ray spectroscopy at room temperature", International Centre for Diffraction Data 2004, Advances in X-ray Analysis, vol. 47, pp. 53-58.
(Continued)

*Primary Examiner* — David A Vanore
(74) *Attorney, Agent, or Firm* — Fish & Richardson P.C.

(57) ABSTRACT

An electron beam microscope includes an energy-sensitive detector to detect backscattered electrons and a signal processor for processing detection signals of the detector. The signal processor includes an analog amplifier. The signal processor also includes a window comparator having a signal input connected to an output of the analog amplifier. A signal generated at an output of the signal processor is generated based on a signal provided at an output the window comparator. The window comparator is configured to output a predetermined signal only if the amplified signal supplied to its signal input is less than or equal to an upper threshold and greater than or equal to a lower threshold.

20 Claims, 4 Drawing Sheets

(56) References Cited

U.S. PATENT DOCUMENTS

| | | | | |
|---|---|---|---|---|
| 4,766,311 | A * | 8/1988 | Seiler | G01B 15/00 250/252.1 |
| 5,493,116 | A * | 2/1996 | Toro-Lira | H01J 37/28 250/310 |
| 6,066,849 | A * | 5/2000 | Masnaghetti | H01J 37/28 250/310 |
| 6,570,154 | B1 * | 5/2003 | Masnaghetti | H01J 37/28 250/310 |
| 6,828,571 | B1 * | 12/2004 | McCord | G01R 31/2653 250/307 |
| 9,165,742 | B1 * | 10/2015 | Simmons | H01J 37/28 |
| 9,805,909 | B1 * | 10/2017 | Shemesh | H01J 37/244 |
| 2004/0026621 | A1 | 2/2004 | Hayn | |
| 2006/0076486 | A1 | 4/2006 | Ohshima et al. | |
| 2007/0200947 | A1 * | 8/2007 | Kobaru | H01J 37/21 348/345 |
| 2009/0101817 | A1 * | 4/2009 | Ohshima | H01J 37/244 250/310 |
| 2009/0222753 | A1 * | 9/2009 | Yamaguchi | G06T 7/0004 715/771 |
| 2013/0099114 | A1 | 4/2013 | Kooijman et al. | |
| 2018/0054575 | A1 * | 2/2018 | Pawlowicz | G01N 23/2251 |
| 2019/0304742 | A1 * | 10/2019 | Han | H01J 37/244 |

OTHER PUBLICATIONS

T. Agemura et al., "Digital BSE Imaging on SEMs", Microscopy and Microanalysis 17 (Suppl 2), 2011, pp. 914-915.

T. Agemura et al. "Surface Sensitive and Compositional SEM Imaging for High Accelerating Voltages in Focused Ion/Electron Beam Systems", Microscopy and Microanalysis 16 (Suppl 2), 2010, pp. 632-633.

German Office Action, with translation thereof, for corresponding DE application No. 10 2018 204 683.2 dated Dec. 17, 2018.

German Notice of Allowance, with translation thereof, for corresponding DE Appl No. 10 2018 204 683.2, dated Apr. 29, 2019.

U. Fano, "*Ionization Yield of Radiations. II. The Fluctuations of the Number of Ions*", Physical Review, vol. 72, No. 1, 1947, pp. 26-29.

L. Reimer, Scanning Electron Microscope: Physics of Image Formation and Microanalysis, 1998, pp. 204 and 231.

* cited by examiner

ELECTRON BEAM MICROSCOPE

CROSS-REFERENCE TO RELATED APPLICATION

This application claims benefit under 35 U.S.C. § 119 to German Application No. 10 2018 204 683.2, filed Mar. 27, 2018. The content of this application is hereby incorporated by reference in its entirety.

FIELD

The present disclosure relates to an electron beam microscope having an energy-sensitive detector for detecting backscattered electrons.

BACKGROUND

An electron beam microscope directs an electron beam onto a sample. The electrons of the beam interact with the sample and generate radiation, such as x-ray photons and backscattered electrons, detected by an energy-sensitive detector. The energy-sensitive detector generates detection signals, having a signal intensity corresponding to the energy of the detected radiation. The detection signals are processed by a signal processor typically including an analog amplifier, an analog-to-digital converter and subsequent electronics to analyze the signal heights of the digital signals. The subsequent electronics limit the count rate which can be detected.

Energy-sensitive detectors are used for performing energy-dispersive x-ray spectroscopy (EDX), in which x-ray photons generated by the electrons impinging on the sample are detected in dependence of the energy, wherein a suitable window, such as a thin membrane, prevents backscattered electrons from reaching the detector. If the window is not used, the detector is also able to detect backscattered electrons, and the backscattered electrons will predominantly contribute to the detection signals since the number of generated backscattered electrons is much higher than the number of generated x-ray photons. However, in such mode of operation, the electron beam current is limited to a few picoamperes since the subsequent electronics limit the maximum count rate which can be processed.

US 2013/0099114 A1 discloses an electron beam microscope having a silicon drift diode (SDD) as its energy-sensitive detector. The detector can be operated in two different modes: a "pulse height measuring mode" in which the signal intensity can be analyzed and which is used for the detection of x-ray photons when a window blocks backscattered electrons from being incident on the detector, and a "current measuring mode" used for the detection of backscattered electrons at higher beam currents and in which the output signal of the detector depends on the number of electron/hole pairs per time unit generated in the detector. While the "current measuring mode" of this electron beam microscope allows detection of backscattered electrons at higher beam currents using a silicon drift diode, the detector does not allow for an energy analysis of the detected backscattered electrons.

SUMMARY

The present disclosure seeks to provide an electron beam microscope having an energy-sensitive detector allowing to perform energy-dependent processing of detection signals corresponding to detected backscattered electrons at higher beam currents.

According to embodiments of the present disclosure, an electron beam microscope includes electron beam optics configured to direct a focused electron beam onto a sample, a detector configured to generate detection signals corresponding to backscattered electrons emerging from the sample and incident on the detector, and a signal processor having an output and configured to process the detection signals generated by the detector and to generate, at its output, a signal based on the processing of the detection signals. The detector is an energy-sensitive detector generating the detection signals such that an intensity of a respective detection signal increases with a kinetic energy of the corresponding detected backscattered electron.

According to exemplary embodiments, the signal processor includes an analog amplifier having a signal input connected to a signal output of the detector, and a window comparator having a signal input connected to an output of the analog amplifier. The signal generated at the output of the signal processor can be generated based on a signal provided at an output of the window comparator. According to exemplary embodiments herein, the analog amplifier may be configured to output, at its output, an amplified signal corresponding to the detection signal supplied to its signal input. According to further exemplary embodiments herein, the window comparator may be configured to output, at its output, a predetermined signal only if the amplified signal supplied to its signal input is less than or equal to an upper threshold and greater than or equal to a lower threshold.

According to exemplary embodiments, the window comparator may have an upper threshold input for setting the upper threshold to a selectable value. According to further exemplary embodiments, the window comparator may have a lower threshold input for setting the lower threshold to a selectable value.

According to exemplary embodiments, the signal processor may include a counter having a signal input connected to an output of the window comparator. The counter has an output and may be configured to generate, at its output, a signal representing a number which is incremented with each occurrence of the predetermined signal supplied to its signal input. The signal generated at the output of the signal processor can be generated based on the signal provided at the output of the counter.

According to exemplary embodiments, the window comparator may have a reset input, wherein the counter is configured to reset the signal generated at its output to a predetermined value if a predetermined signal is applied to its reset input.

According to exemplary embodiments, the signal generated at the output of the counter is a digital signal.

According to further exemplary embodiments, the signal processor includes a resistor connecting the output of the window comparator to ground.

According to exemplary embodiments, the signal generated at the output of the analog amplifier is an analog signal.

According to some embodiments, the detector is one of a silicon drift diode (SDD), a PIN diode, a Schottky diode and an avalange diode.

According to further exemplary embodiments, the electron beam microscope further includes a controller configured to control the electron optics in order to direct the focused electron beam to plural of different locations on the sample, to maintain the focused electron beam at each of the plural locations for a predetermined dwell time, and to store data associated with each of the plural different locations representing changes in the output signal of the counter while the focused electron beam is maintained at a same location on the sample.

BRIEF DESCRIPTION OF THE DRAWINGS

It is noted that not all possible embodiments necessarily exhibit each and every, or any, of the advantages identified herein. The forgoing as well as other advantageous features of this disclosure will be more apparent from the following detailed description of exemplary embodiments with reference to the accompanying drawings, in which.

DETAILED DESCRIPTION OF EXEMPLARY EMBODIMENTS

Figure 1:
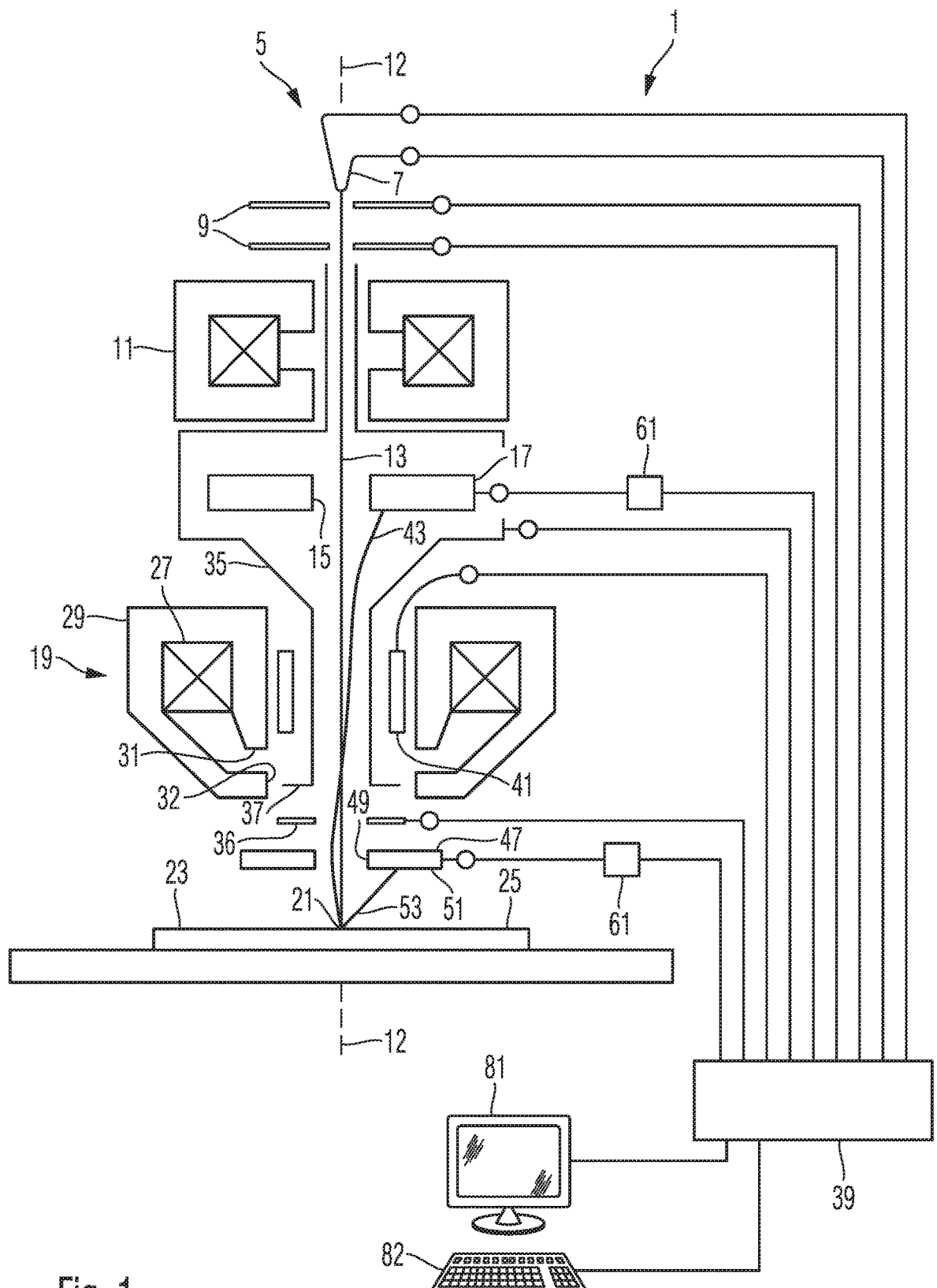
FIG. 1 is a schematic illustration of an electron beam microscope according to an embodiment.

FIG. 1 is a schematic illustration of an exemplary embodiment of an electron beam microscope 1. The electron beam microscope 1 includes electron optics including an electron beam source 5 having a cathode 7 and extractor and suppressor electrodes 9 for generating a primary particle beam 13. The primary particle beam 13 traverses a condenser lens 11 of the electron optics, an aperture 15 provided in an electron detector 17, and an objective lens 19 of the electron optics for focusing the primary particle beam 13 at a location 21 in an object plane 23. A surface of a sample 25 to be inspected is disposed in the object plane 23.

The objective lens 19 includes a ring coil 27 provided in a ring-shaped yoke having a ring-shaped upper pole piece 31 and a ring-shaped lower pole piece 32 such that a ring-shaped gap is formed between the upper and lower pole pieces 31, 32. A magnetic field for focusing the electron beam 13 is generated in this gap.

The electron beam microscope 1 further includes a beam tube 35 which enters and partially traverses the objective lens 19. An end electrode 37 is provided at a bottom end of the beam tube 35. A terminal electrode 36 is disposed between the end electrode 37 and the object plane, wherein an electrostatic field generated between the end electrode 37 and terminal electrode 36 provides a focusing power on the primary electron beam 13. The focusing power provided by the electrostatic field between the electrodes 36 and 37 and the focusing power provided by the magnetic field between the pole pieces 31 and 32 commonly provide the focusing power of the objective lens 19 of the electron beam microscope 1.

A controller 39 is provided for supplying suitable voltages to the terminal electrode 36, the end electrode 37, the cathode 7 and the extractor and suppressor electrodes 9 such that an electron beam focus is formed in the object plane.

These voltages can be selected such that the electrons of the primary electron beam have a predetermined kinetic energy when they are incident on the object 25 at location 21. It is in particular possible that the controller 39 supplies a voltage corresponding to ground potential or a voltage differing from ground potential to the terminal electrode 36.

The electron optics further includes deflectors 41 which are also controlled by the controller 39 for deflecting the electron beam 13 and for varying the location 21 at which the primary electron beam 13 is incident on the object 25 in the object plane 23. By deflecting the primary electron beam it is in particular possible to systematically scan the primary particle beam across a portion of the surface of the object 25.

The primary particle beam incident on the object 25 results in that secondary electrons emerge from the object 25. A portion of such secondary electrons may enter into the beam tube 35 such that they are detected by the electron detector 17. In the context of the present disclosure, the term secondary electrons includes all types of electrons which are caused to emerge from the object by directing the primary particle beam onto the object and which can be detected by the electron detector 17. The term secondary electrons in particular includes backscattered electrons having a kinetic energy which corresponds to or is somewhat smaller than the kinetic energy of the primary particles incident on the object. The term further includes secondary electrons having, when they emerge from the surface of the object, a kinetic energy which is substantially smaller than the kinetic energy of the primary particles upon their incidence onto the object. FIG. 1 schematically shows an exemplary trajectory of a secondary electron which is incident on the electron detector 17 at reference numeral 43.

The electron beam microscope 1 further includes a further detector 47 disposed in between of the objective lens 19 and the object plane 23. The detector 47 includes a central aperture 49 allowing the primary particle beam 13 and secondary electrons 43 to traverse the detector 47. The detector 47 includes plural detection surfaces 51 located at a radial distance from a main axis 12 of the objective lens. The detector 47 is provided for detecting both secondary electrons and X-rays generated by the primary particle beam 13 incident on the object. An exemplary trajectory of a secondary electron or X-ray generated by the primary electron beam 13 at location 21 and incident on the detector 47 is indicated in FIG. 1 at reference numeral 53.

The detectors 17 and 47 of the electron microscope 1 of the illustrated embodiment are examples of detectors which an electron beam microscope according to embodiments of the disclosure may have. The detectors 17 and 47 are arranged at different positions relative to the electron beam optics and sample 23. Electron beam microscopes according to other embodiments may include only one of these detectors or none of these detectors if another detector is disposed relative to the electron beam optics and sample 23 such that it is capable to detect backscattered electrons.

At least one of the detectors 17, 47 for detecting backscattered electrons is an energy-sensitive detector generating detection signals such that an intensity of the respective detection signal increases with a kinetic energy of the corresponding detected backscattered electron. In the illustrated embodiment, the detector 17, 47 is a silicon drift diode (SDD). In other embodiments, other types of energy-sensitive detectors, such as a pin diode, a Schottky diode and an avalange diode can also be used.

The detection signals generated by the detector 17, 47 are processed by a signal processor 61, and signals generated by the signal processor 61 are supplied to the controller 39.

Figure 2:
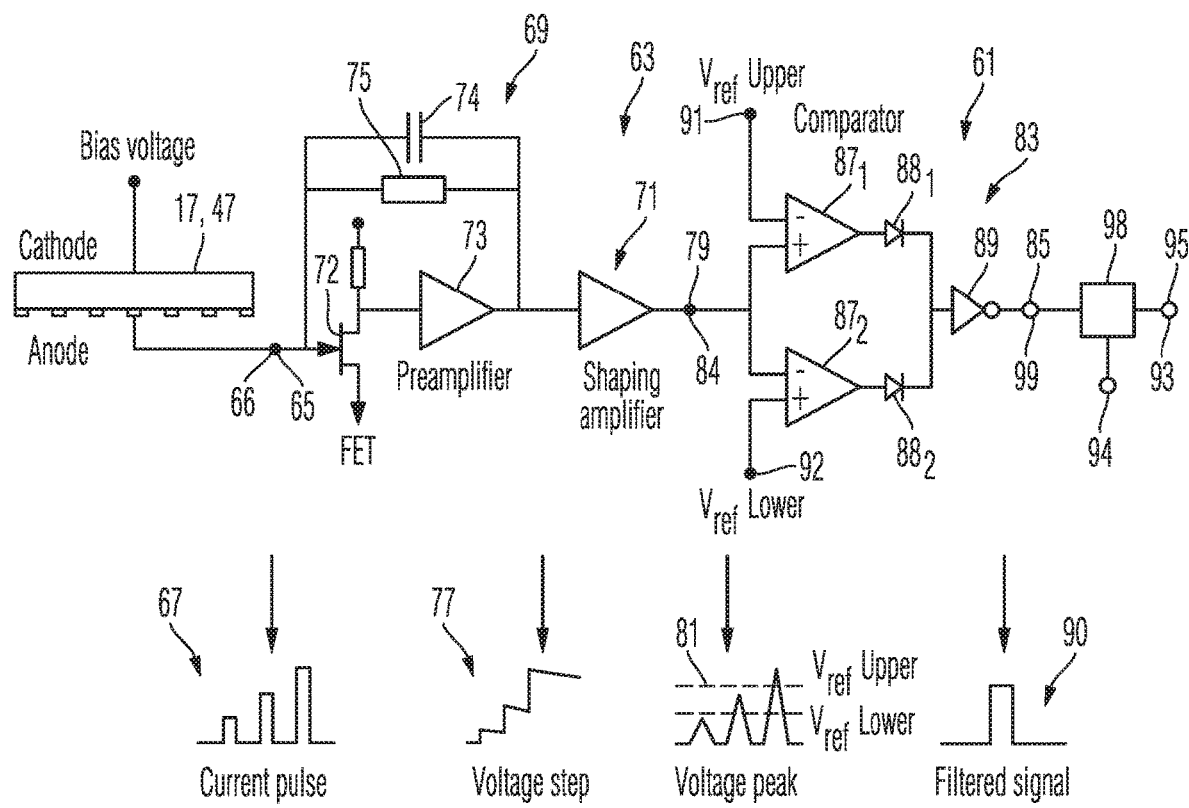
FIG. 2 is a circuit diagram of a signal processor of the electron beam microscope shown in FIG. 1.

FIG. 2 shows a circuit diagram of the signal processor 61. The signal processor 61 includes an analog amplifier 63 having an input 65 connected to an output 66 of the detector 17, 47. Exemplary series of three detection signals of different signal intensities supplied to the signal input 65 of the analog amplifier 63 are schematically illustrated at 67 in FIG. 2. The analog amplifier 63 includes a preamplifier 69 and a shaping amplifier 71. The preamplifier 69 includes an FET 72, an operational amplifier 73 and a feedback circuit including a capacitor 74 and a resistor 75. A signal generated by the preamplifier from the exemplary detection signals 67 is indicated at 77 in FIG. 2. The preamplifier may generate a time integrated voltage signal of the input signal 67 which may itself include a series of individual current pulses. Thus, the output signal 77 generated by the preamplifier from a series of current input pulses generally is a voltage step signal 77 wherein each incoming current pulse causes a step-wise increase of the output voltage signal. The heights of the voltage steps are correlated with the heights of the corresponding input current pulses causing this voltage step.

The shaping amplifier 71 generates, at the output 79 of the analog amplifier 63, an output signal schematically indicated at 81 in FIG. 2 from the signal 77 inputted to the shaping amplifier 71. The output signal 81 of the shaping amplifier 71 can be regarded as a time derivative of the signal 77 which is shown as a step shaped signal in FIG. 2. The signal 81 corresponds to the signal 67 in that pulses of different signal intensities in the signal 67 correspond to pulses of different amplified intensities in the signal 81. Moreover, the pulses in signal 81 have shapes determined by the shaping amplifier 71 and suitable for further analysis based on the pulse intensities.

Thus, the combination of the preamplifier 69 and the shaping amplifier 71 generates a series of amplified output voltage peaks 81 from a series of input pulses 67, which are of electrical current pulses in the illustrated embodiment. The amplified output voltage peaks have a peak heights which are correlated with the heights of the corresponding input current pulses 67. Herein, the output voltage peaks have a predefined reproducible shape independent from the shapes of the corresponding input current pulses. The same or similar shapes of the output voltage peaks can be advantageous in view of a subsequent signal analysis.

The signal processor 61 further includes a window comparator 83 having an input 84 connected to the output 79 of the analog amplifier 63. The window comparator 83 has an output 85 and is configured to output, at its output 85, a predetermined signal only if the amplified signal 81 supplied to its signal input 84 is less than or equal than an upper threshold and greater than or equal to a lower threshold. The window comparator 83 may have any configuration in order to perform this function. In the present example, the window comparator 83 includes two operational amplifiers $87_1$ and $87_2$, two diodes $88_1$ and $80_2$ and an inverter 89. The non-inverting input of the operational amplifier $87_1$ and the inverting input of the operational amplifier $87_2$ are connected to the signal input 84 of the window comparator 83. The inverting input of operational amplifier $87_1$ is connected to an upper threshold input 91 of the window comparator 83, and the non-inverting input of the operational amplifier $87_2$ is connected to a lower threshold input 92 of the window comparator 83. The anodes of the diodes $88_1$, $88_2$ are connected to the outputs of the operational amplifiers $87_1$ and $87_2$, respectively. The cathodes of the diodes $88_1$ and $88_2$ are connected to the input of the inverter 89. The output of the inverter 89 is connected to the output 85 of the window comparator.

Thus, the output signal of the window comparator 83 is a series of pulse signals 90 wherein only those input current pulses in the input signal 67 which have a sufficient pulse height generate a corresponding output pulse in the series of pulse signals 90 at the output 85 of window comparator 83.

The signal processor 61 further includes a counter 98 having an input 99 connected to the output 85 of the window comparator 83. The counter has an output 93 and is configured to generate, at its output 93, a signal representing a number which is incremented with each occurrence of a pulse in the signal 90 supplied to its input 99. The counter 98 further includes a reset input 94, wherein the counter is configured to reset the signal generated at its output 93 to a predetermined value, such as zero, if a predetermined signal is applied to the reset input 94.

The output 93 of the counter 98 may provide an output 95 of the signal processor 61 connected to the controller 39. It is, however, possible that further circuits can be provided between the output 93 of the counter 98 and the controller 39, that the shaping amplifier may include other circuits to perform a desired shaping of the signals, and also the preamplifier may have a different suitable configuration.

Backscattered electrons generated by the incident beam 13 on the sample 23 generally have a broad spectrum of their kinetic energies. The highest possible kinetic energy of a backscattered electron corresponds to the kinetic energy of the incident electron. A great portion of the backscattered electrons have kinetic energies which are little less than this maximum kinetic energy. They are often referred to as low-loss backscattered electrons in the art. The remaining backscattered electrons having a kinetic energy significantly lower than the maximum kinetic energy are referred to as high-loss backscattered electrons in the art.

The signal processor 61 allows filtering of the detection signals 67 of the detector 17, 47 according to an energy range bound by an upper threshold energy and a lower threshold energy. The upper threshold energy and lower threshold energy can be controlled by the controller 39 by supplying suitable signals to the upper threshold input 91 and lower threshold input 92, respectively, of the window comparator 61. The counter 98 will only count detection signals corresponding to backscattered electrons having kinetic energies within the energy range selected by the controller 39.

Figure 3A:
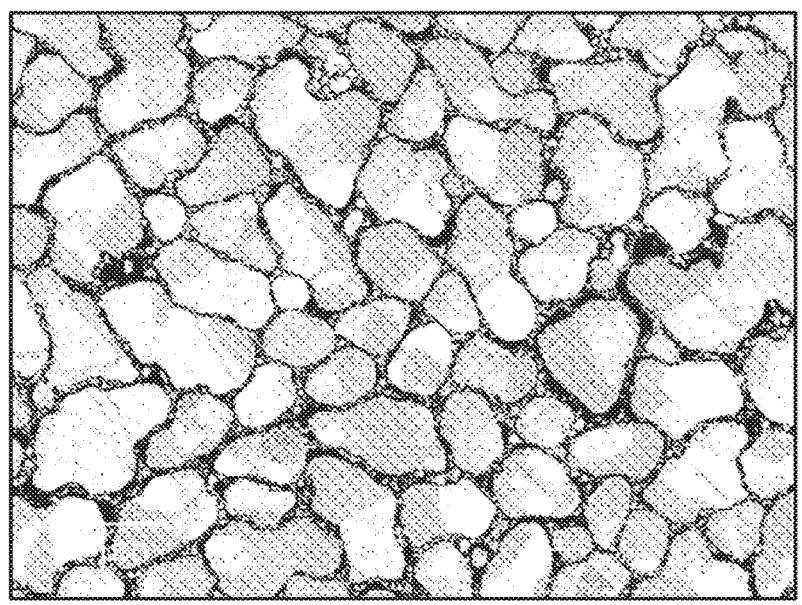
FIGS. 3A, 3B and 3C are backscattered electron images recorded at different energy thresholds.
Figure 3B:
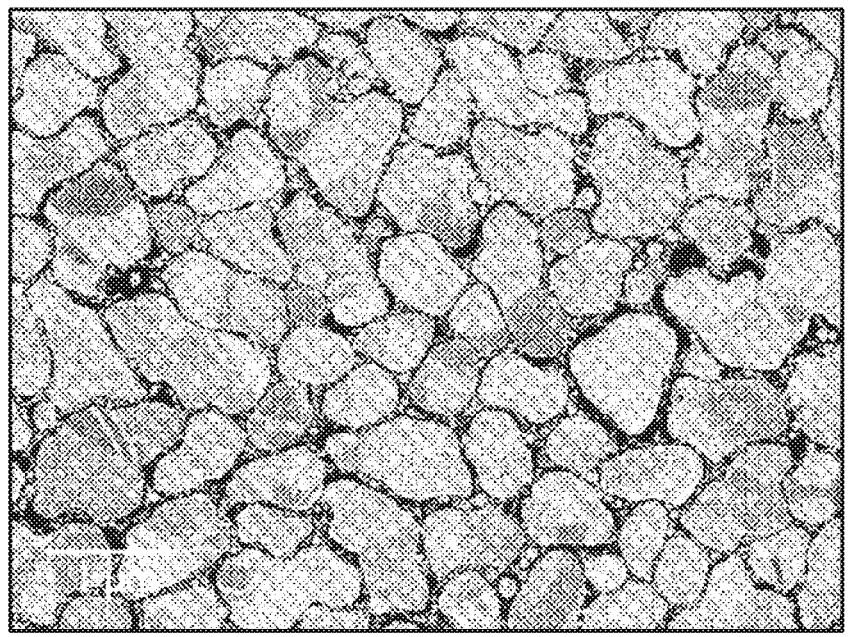
Figure 3C:
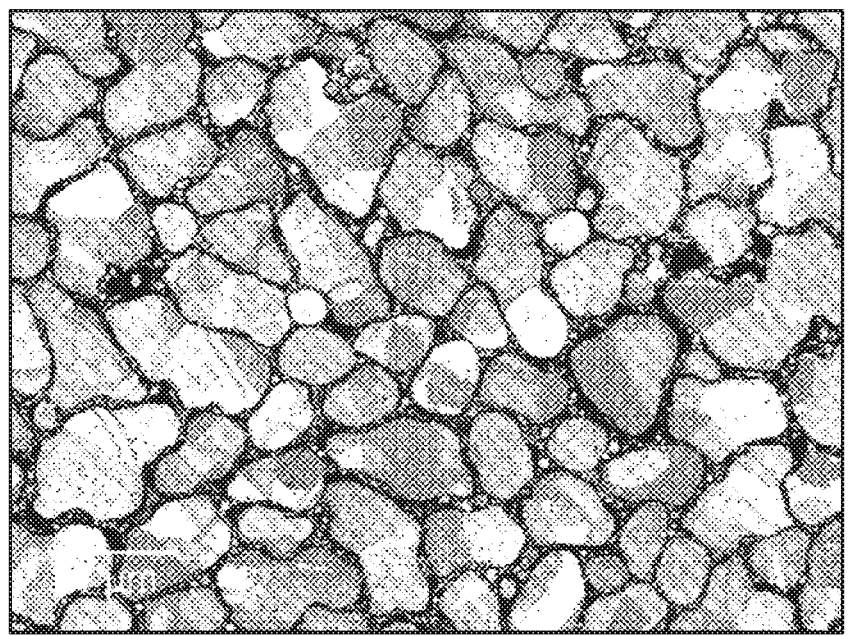

FIGS. 3A, 3B and 3C show images generated from detected backscattered electrons having kinetic energies from three different ranges. The imaged sample is a thin gold film on a carbon substrate. The electrons of the electron beam incident on the sample have a kinetic energy of 2 kV, and the beam current amounts to 50 picoamperes. The grey levels in the images represent changes of the value of the counter occurring during a duration, also referred to as the dwell time, during which the focused electron beam is directed to a same location on the sample.

FIG. 3A shows an image of the sample wherein both low-loss backscattered electrons and high-loss backscattered electrons are counted.

FIG. 3B shows the image of the same sample wherein only high-loss backscattered electrons have been counted. In the illustrated example, backscattered electrons having kinetic energies between 100 eV and 1,950 eV are used as the high-loss backscattered electrons in FIG. 3B.

FIG. 3C shows the image of the same sample wherein only the low-loss backscattered electrons have been counted. In the illustrated example, backscattered electrons having kinetic energies between 1,950 eV and 2,000 eV are used as the low-loss backscattered electrons. It appears that FIG. 3B shows the lowest contrast within the particle grains such that not much information relative to material properties can be obtained from that image. This is contrary to FIG.

3C which shows rich structures within the grains originating from different material compositions and crystal orientations within the grains.

The comparison of FIGS. 3A, 3B and 3C indicates that interesting information can be obtained from detected backscattered electrons when it is possible to filter the backscattered electrons contributing to the image based on an energy range. It is to be noted that other energy ranges different from the two categories low-loss backscattered electrons and high-loss backscattered electrons of the above example can be selected according to an application.

The filtering of the signals corresponding to backscattered electrons achieved by the signal processor illustrated above is very fast since it does not require digital-to-analog conversion and processing of the signal intensities represented by digital signals using a computer. Therefore, the signal processor 61 allows for very high count rates of the detected backscattered electrons which means that relatively high beam currents of the focused electron beam can be used, which increases the throughput. In particular, beam currents which can be used can be significantly higher than 100 picoamperes.

A further embodiment of an electron microscope and a signal processor will be illustrated with reference to FIG. 4 below. This further embodiment differs from the embodiment illustrated above in a detail of a portion of the signal processor illustrated in FIG. 4.

Figure 4:
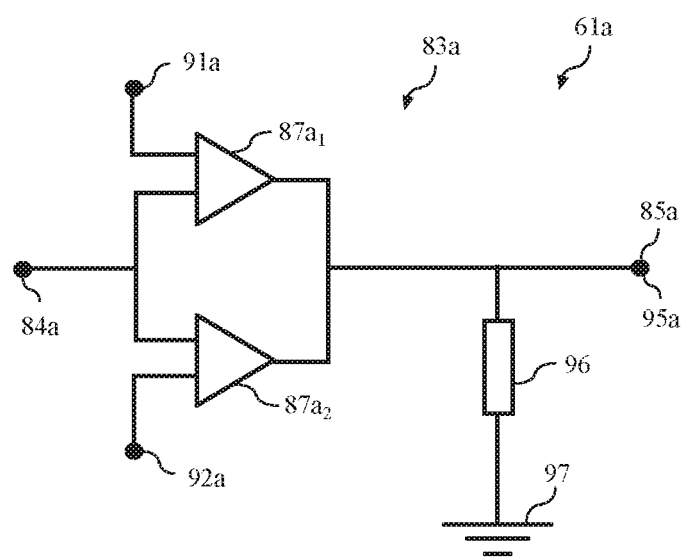
FIG. 4 is a circuit diagram of a portion of a signal processor of the electron beam microscope shown in FIG. 1 according to a further embodiment.

Elements shown in FIG. 4 having a same or similar function as corresponding elements of the embodiment illustrated above are indicated by the same reference numerals which are used in FIGS. 1 to 3 but which are supplemented with the small letter 'a'. The signal processor 61a illustrated in FIG. 4 has an analog amplifier which is not shown in FIG. 4 and which has an output connected to an input 84a of a window comparator 83a. The window comparator has upper and lower threshold inputs 91a and 92a connected to operational amplifiers $87a_1$ and $87a_2$, respectively. The outputs of the operational amplifier $87a_1$ and $87a_2$ are connected to an output 85a of the window comparator 83a. The output 85a of the window comparator 83a is connected to ground 97 via a resistor 96. The output 85a of the window comparator 83a can be directly used as an output 95a of the signal processor 61a. A signal generated at the output 85a of window comparator 83a is indicative of a rate at which backscattered electrons within a given energy range are incident on the sample. The output signal provided at the output 85a can be further processed as an analog signal having a voltage dependent on the rate of the incident backscattered electrons. Compared to the embodiment of the signal processor shown in FIG. 2, the signal processor shown in FIG. 4 has a window comparator having fewer elements since the diodes 88 and the inverter 89 can be omitted.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

What is claimed is:

1. An electron beam microscope, comprising:
   electron beam optics configured to direct a focused electron beam onto a sample;
   a detector configured to generate detection signals corresponding to backscattered electrons emerging from the sample and incident on the detector; and
   a signal processor having an output and configured to process the detection signals generated by the detector and to generate, at its output, a signal based on the processing of the detection signals;
   wherein the detector is an energy-sensitive detector generating the detection signals such that an intensity of a respective detection signal increases with a kinetic energy of the corresponding detected backscattered electron;
   wherein the signal processor includes an analog amplifier having a signal input connected to a signal output of the detector, a window comparator having a signal input connected to an output of the analog amplifier, wherein the signal generated at the output of the signal processor is generated based on a signal provided at an output of the window comparator;
   wherein the analog amplifier is configured to output, at its output, an amplified signal corresponding to the detection signal supplied to its signal input;
   wherein the window comparator is configured to output, at its output, a predetermined signal only if the amplified signal supplied to its signal input is less than or equal to an upper threshold and greater than or equal to a lower threshold.

2. The electron beam microscope of claim 1, wherein the window comparator has an upper threshold input for setting the upper threshold to a selectable value, and a lower threshold input for setting the lower threshold to a selectable value.

3. The electron beam microscope of claim 1, wherein the signal processor further comprises a counter having a signal input connected to the output of the window comparator;
   wherein the counter has an output and is configured to generate, at its output, a signal representing a number which is incremented with each occurrence of the predetermined signal supplied to its signal input.

4. The electron beam microscope of claim 3, wherein the signal processor is configured so that the signal generated at the output of the signal processor is generated based on the signal provided at the output of the counter.

5. The electron beam microscope of claim 3, wherein the signal processor has a reset input, wherein the counter is configured to reset the signal generated at its output to a predetermined value if a predetermined signal is applied to its reset input.

6. The electron beam microscope of claim 3, wherein the counter is configured so that the signal generated at the output of the counter is a digital signal.

7. The electron beam microscope of claim 1, wherein the signal processor further comprises a resistor connecting the output of the window comparator to ground.

8. The electron beam microscope of claim 1, wherein the analog amplifier is configured so that the signal generated at the output of the analog amplifier is an analog signal.

9. The electron beam microscope of claim 1, wherein the detector is one of a silicon drift diode (SDD), a PIN diode, a Schottky diode and an avalange diode.

10. The electron beam microscope of claim 1, further comprising a controller configured to control the electron optics in order to direct the focused electron beam to plural of different locations on the sample, to maintain the focused electron beam at each of the plural locations for a predetermined dwell time, and to store data associated with each of the plural different locations representing changes in the output signal of the counter while the focused electron beam is maintained at a same location on the sample.

11. The electron beam microscope of claim 4, wherein the signal processor has a reset input, wherein the counter is configured to reset the signal generated at its output to a predetermined value if a predetermined signal is applied to its reset input.

12. The electron beam microscope of claim 4, wherein the counter is configured so that the signal generated at the output of the counter is a digital signal.

13. The electron beam microscope of claim 5, wherein the counter is configured so that the signal generated at the output of the counter is a digital signal.

14. The electron beam microscope of claim 2, wherein the signal processor further comprises a counter having a signal input connected to the output of the window comparator;
wherein the counter has an output and is configured to generate, at its output, a signal representing a number which is incremented with each occurrence of the predetermined signal supplied to its signal input.

15. The electron beam microscope of claim 14, wherein the signal processor is configured so that the signal generated at the output of the signal processor is generated based on the signal provided at the output of the counter.

16. The electron beam microscope of claim 14, wherein the signal processor has a reset input, wherein the counter is configured to reset the signal generated at its output to a predetermined value if a predetermined signal is applied to its reset input.

17. The electron beam microscope of claim 14, wherein the counter is configured so that the signal generated at the output of the counter is a digital signal.

18. The electron beam microscope of claim 15, wherein the signal processor has a reset input, wherein the counter is configured to reset the signal generated at its output to a predetermined value if a predetermined signal is applied to its reset input.

19. The electron beam microscope of claim 15, wherein the counter is configured so that the signal generated at the output of the counter is a digital signal.

20. The electron beam microscope of claim 16, wherein the counter is configured so that the signal generated at the output of the counter is a digital signal.

* * * * *

UNITED STATES PATENT AND TRADEMARK OFFICE
CERTIFICATE OF CORRECTION

PATENT NO. : 10,615,000 B2  
APPLICATION NO. : 16/364894  
DATED : April 7, 2020  
INVENTOR(S) : Luyang Han et al.

Page 1 of 1

It is certified that error appears in the above-identified patent and that said Letters Patent is hereby corrected as shown below:

On the Title Page

Column 2 (Abstract), Line 8, after "output" insert -- to --;

In the Specification

Column 2, Line 61, delete "avalange" and insert -- avalanche --;

Column 4, Line 58, delete "avalange" and insert -- avalanche --;

Column 7, Lines 28-53, delete "Elements shown in FIG. 4 having a same or similar function as corresponding elements of the embodiment illustrated above are indicated by the same reference numerals which are used in FIGS. 1 to 3 but which are supplemented with the small letter 'a'. The signal processor 61a illustrated in FIG. 4 has an analog amplifier which is not shown in FIG. 4 and which has an output connected to an input 84a of a window comparator 83a. The window comparator has upper and lower threshold inputs 91a and 92a connected to operational amplifiers 87a1 and 87a2, respectively. The outputs of the operational amplifier 87a1 and 87a2 are connected to an output 85a of the window comparator 83a. The output 85a of the window comparator 83a is connected to ground 97 via a resistor 96. The output 85a of the window comparator 83a can be directly used as an output 95a of the signal processor 61a. A signal generated at the output 85a of window comparator 83a is indicative of a rate at which backscattered electrons within a given energy range are incident on the sample. The output signal provided at the output 85a can be further processed as an analog signal having a voltage dependent on the rate of the incident backscattered electrons. Compared to the embodiment of the signal processor shown in FIG. 2, the signal processor shown in FIG. 4 has a window comparator having fewer elements since the diodes 88 and the inverter 89 can be omitted." and insert the same on Column 7, Line 27 as a continuation of the same paragraph;

In the Claims

Column 8, Line 60, Claim 9, delete "avalange" and insert -- avalanche --.

Signed and Sealed this  
Fourteenth Day of July, 2020

Andrei Iancu  
*Director of the United States Patent and Trademark Office*